(12) United States Patent
Kubotera et al.

(10) Patent No.: US 8,698,536 B2
(45) Date of Patent: Apr. 15, 2014

(54) VARIABLE DELAY CIRCUIT

(71) Applicant: Fujitsu Limited, Kawasaki (JP)

(72) Inventors: Kazumasa Kubotera, Kawasaki (JP); Yasutaka Kanayama, Inagi (JP); Masaki Fujioka, Yokohama (JP); Hiroshi Miyake, Yokohama (JP)

(73) Assignees: Fujitsu Limited, Kawasaki (JP); Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/778,229

(22) Filed: Feb. 27, 2013

(65) Prior Publication Data

US 2013/0257501 A1 Oct. 3, 2013

(30) Foreign Application Priority Data

Mar. 30, 2012 (JP) ................................. 2012-082010

(51) Int. Cl.
*H03H 11/26* (2006.01)
(52) U.S. Cl.
USPC .......................................................... 327/276
(58) Field of Classification Search
USPC .......................................... 327/276, 277, 284
See application file for complete search history.

(56) References Cited

U.S. PATENT DOCUMENTS

| | | | |
|---|---|---|---|
| 6,621,316 B1 | 9/2003 | Kirsch | |
| 6,876,717 B1 | 4/2005 | Wang et al. | |
| 8,564,345 B2 * | 10/2013 | Yu | 327/158 |
| 2007/0132497 A1 | 6/2007 | Chae | |
| 2010/0102863 A1 | 4/2010 | Kojima | |
| 2012/0249200 A1 * | 10/2012 | Yu | 327/159 |

FOREIGN PATENT DOCUMENTS

| | | |
|---|---|---|
| JP | 2001-282381 | 10/2001 |
| JP | 2005-50235 | 2/2005 |
| JP | 2009-10737 | 1/2009 |

\* cited by examiner

*Primary Examiner* — William Hernandez
(74) *Attorney, Agent, or Firm* — Staas & Halsey LLP

(57) ABSTRACT

Plural unit delay circuits connected in series and an output circuit that non-inverts or inverts and outputs an output signal in accordance with a set signal are included. A first unit delay circuit includes a selector that outputs a signal input to a second input terminal when the set signal is "0", and outputs a signal input to a first input terminal when the set signal is "1", and an inverter that inverts and outputs an output of the selector from a second output terminal. A second unit delay circuit includes an inverter that inverts the signal input to the first input terminal and outputs from a first output terminal, and a selector that outputs the signal input to the second input terminal when the set signal is "0", and outputs an output of the inverter when the set signal is "1" from the second output terminal.

9 Claims, 6 Drawing Sheets

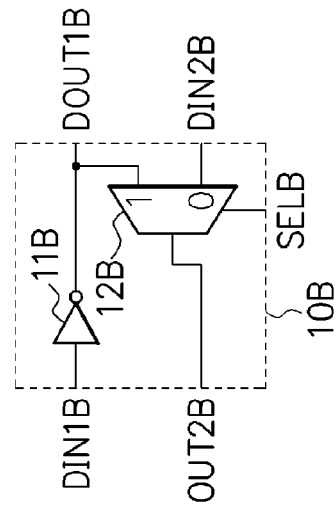
F I G. 1A
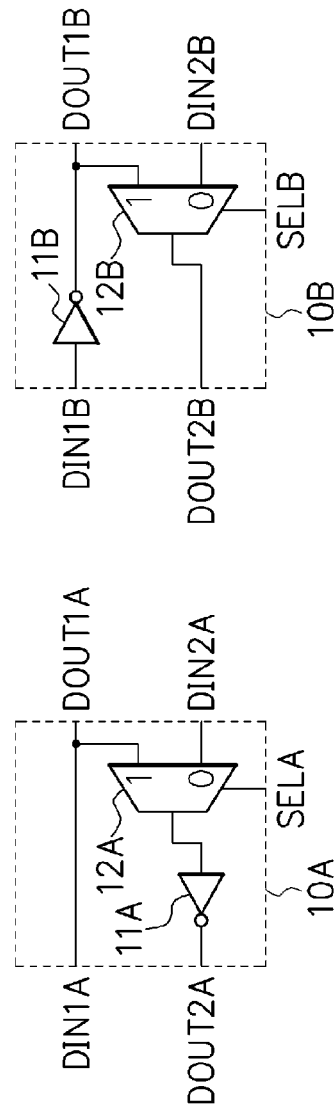
F I G. 1B
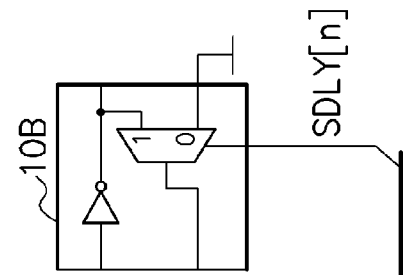
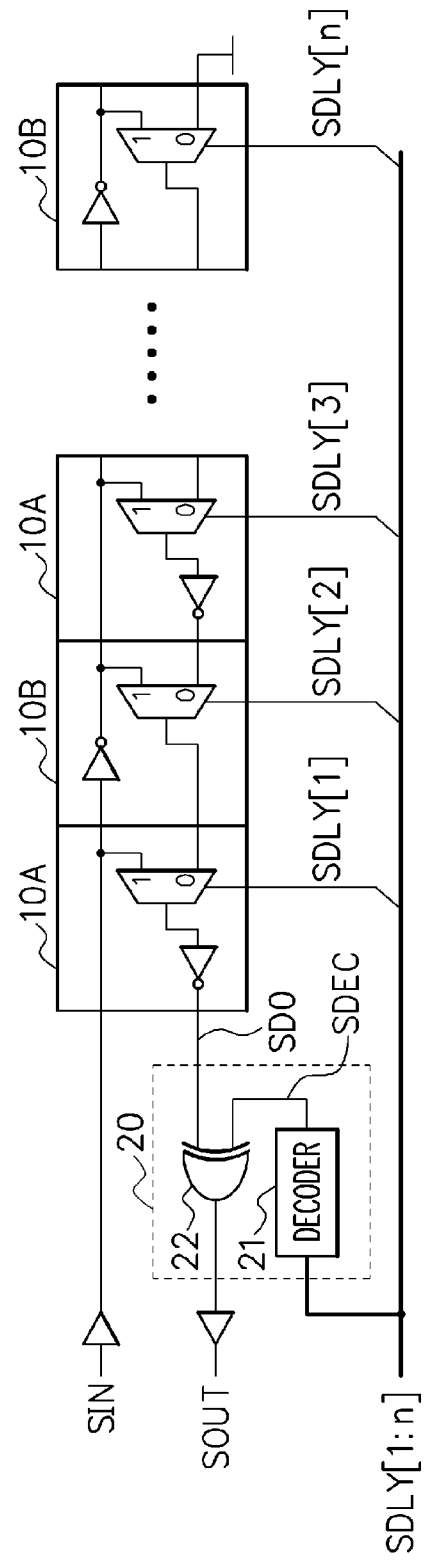
F I G. 1C

| SIN | SDEC | SD0 | SOUT |
|---|---|---|---|
| 0 | 0 | 0 | 0 |
| 1 | (NON-INVERSION) | 1 | 1 |
| 0 | 1 | 1 | 0 |
| 1 | (INVERSION) | 0 | 1 |

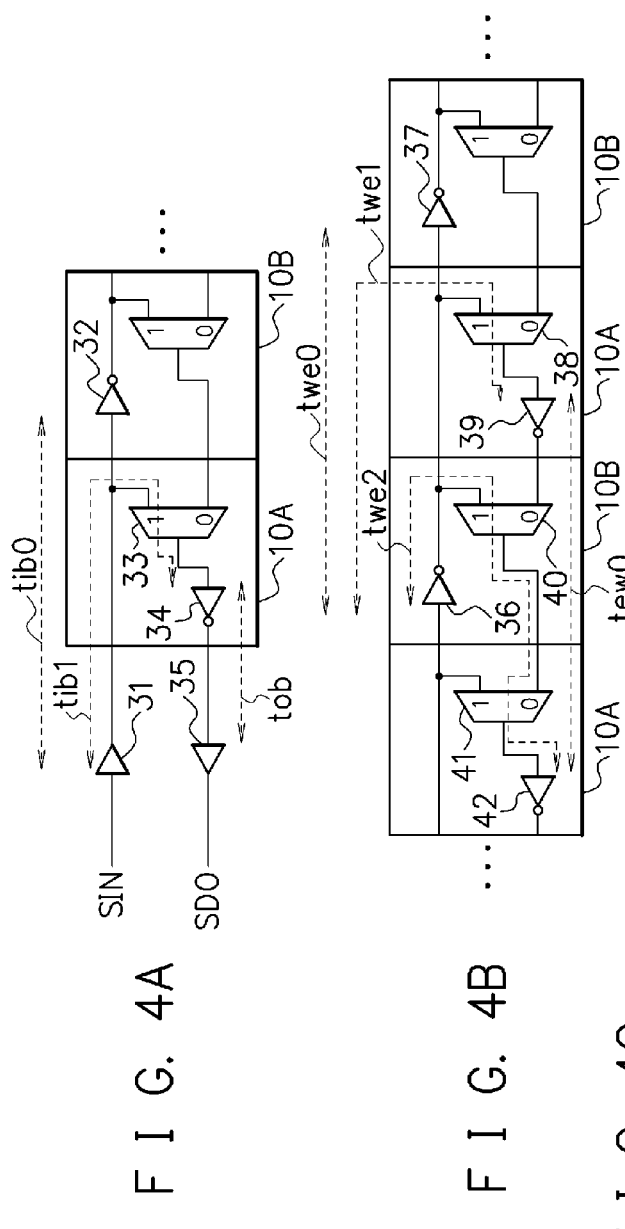

F I G. 7
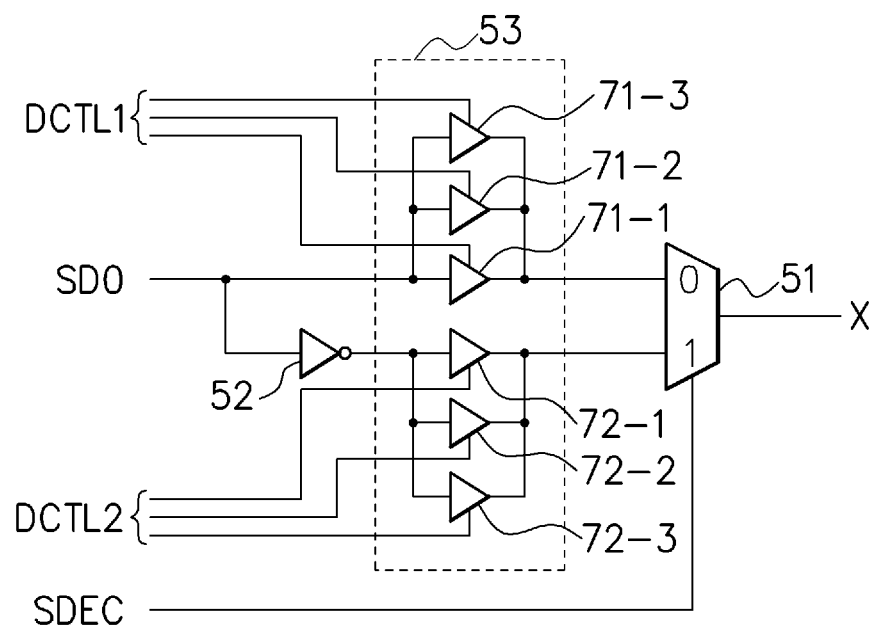

VARIABLE DELAY CIRCUIT

CROSS-REFERENCE TO RELATED APPLICATION

This application is based upon and claims the benefit of priority of the prior Japanese Patent Application No. 2012-082010, filed on Mar. 30, 2012, the entire contents of which are incorporated herein by reference.

FIELD

The embodiment discussed herein is directed to a variable delay circuit of which delay amount is variable.

BACKGROUND

A variable delay circuit is a circuit capable of adjusting a delay amount between input and output of a signal. FIG. 8 is a view illustrating a configuration example of a conventional variable delay circuit. In the variable delay circuit illustrated in FIG. 8, plural unit delay circuits 100 are connected in series. Each of the unit delay circuits 100 includes inverters 101, 102, and a selector 103.

When a logical value of a delay set signal SDLY input thereto is "0" (zero), a signal input to a first input terminal is output from a first output terminal via the inverter 101, and a signal input to a second input terminal is output from a second output terminal via the selector 103 and the inverter 102 in the unit delay circuit 100. When the logical value of the delay set signal SDLY input thereto is "1", the signal input to the first input terminal is output from the second output terminal via the inverter 101, the selector 103, and the inverter 102 in the unit delay circuit 100.

In the variable delay circuit illustrated in FIG. 8, an input signal SIN is input to a first input terminal of a first stage unit delay circuit 100, and an output signal SOUT is output from a second output terminal of the first stage unit delay circuit 100. Besides, a first output terminal of an i-th stage unit delay circuit 100 and a first input terminal of an (i+1)-th stage unit delay circuit 100 are connected, and a second input terminal of the i-th stage unit delay circuit 100 and a second output terminal of the (i+1)-th stage unit delay circuit 100 are connected. A delay set signal SDLY[i] is input to the i-th stage unit delay circuit 100. Here, "i" is a subscript, and "i" is a natural number satisfying "'i'=1 to 'n'".

As stated above, the plural unit delay circuits 100 are connected in series, and the number of inverters between the input and output of the signal is controlled in accordance with the delay set signal SDLY[1:n], and thereby, it is possible for the variable delay circuit to adjust a delay amount between the input and output. Note that resolution of delay time at the variable delay circuit illustrated in FIG. 8 is determined by an intrinsic delay of the unit delay circuit 100.

When the signal is sped up while maintaining the number of delay stages in the variable delay circuit as illustrated in FIG. 8, it is preferably to have higher resolution of the delay time, namely, the delay time of the unit delay circuit is preferably to be short. For example, it is possible for the unit delay circuit 100 to shorten the delay time by making sizes of the inverters 101, 102 large, but a component area increases. Besides, the sizes of the inverters 101, 102 depend on a technology if they are tried to be made large, and there is a limit as device characteristics to shorten the delay time. It is conceivable to shorten the delay time by making the unit delay circuit 100 to have only one inverter either of the inverter 101 or the inverter 102, but the inverter exists at one side of either an input side or an output side, and a waveform deteriorates at the side where the inverters do not exist. The delay time changes caused by the deterioration of the waveform, and linearity of the delay time in accordance with the number of delay stages is lost in the variable delay circuit.

Besides, a technology is proposed in which resolution of delay time is set to be (t2−t1) by changing the number of buffers and selectors where an input signal is to be passed in a delay circuit including buffers each having a delay time t1 and selectors each having a delay time t2 (t1<t2<t1×2) (refer to Patent Document 1). A technology is proposed in which a first delay circuit where plural delay elements are connected in series and a delay time is adjusted by switching the number of delay elements where a signal is to be passed, and a second delay circuit including a delay element having a delay time which is not divided by the delay time at the delay element of the first delay circuit are combined to thereby improve resolution of the delay time compared to a case in which only the first delay circuit is included (refer to Patent Document 2). A technology is proposed in which logical inversion type two-input selectors are connected in multistage, an inversion signal of an input signal is input to an odd numbered selector, a non-inversion signal of the input signal is input to an even numbered selector, the number of stages of the selectors where the input signal is to be passed is switched to thereby adjust the delay time, and a duty ratio of the signal is maintained (refer to Patent Document 3).

[Patent Document 1] Japanese Laid-open Patent Publication No. 2005-50235

[Patent Document 2] Japanese Laid-open Patent Publication No. 2009-10737

[Patent Document 3] Japanese Laid-open Patent Publication No. 2001-282381

SUMMARY

According to an aspect of the embodiment, a variable delay circuit includes: plural unit delay circuits in which a first output terminal of an i-th stage ("i" is a natural number) unit delay circuit and a first input terminal of an (i+1)-th stage unit delay circuit are connected, and a second input terminal of the i-th stage unit delay circuit and a second output terminal of the (i+1)-th stage unit delay circuit are connected; and an output circuit that non-inverts or inverts a signal output from a second output terminal of a first stage unit delay circuit in accordance with delay set information and outputs the signal. The plural unit delay circuits are one or more first unit delay circuits and one or more second unit delay circuits. The first unit delay circuit includes: a selector that outputs a signal input to a second input terminal when the delay set information corresponding thereto is in a first state, and outputs a signal input to a first input terminal when the delay set information is in a second state; and an inverter that inverts an output of the selector and outputs from a second output terminal, and the first input terminal and the first output terminal are connected. The second unit delay circuit includes: an inverter that inverts a signal input to a first input terminal and outputs from a first output terminal; and a selector that outputs a signal input to a second input terminal from a second output terminal when the delay set information corresponding thereto is in a first state, and outputs an output of the inverter from the second output terminal when the delay set information is in a second state.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1A and FIG. 1B are views illustrating a configuration example of a unit delay circuit in an embodiment.

FIG. 1C is a view illustrating a configuration example of a variable delay circuit in this embodiment.

FIG. 4A to FIG. 4C are views to explain a delay time and a change thereof at the variable delay circuit in this embodiment.

FIG. 7 is a view illustrating another example of the delay adjustment circuit in this embodiment.

DESCRIPTION OF EMBODIMENT

Figures 2, 3:
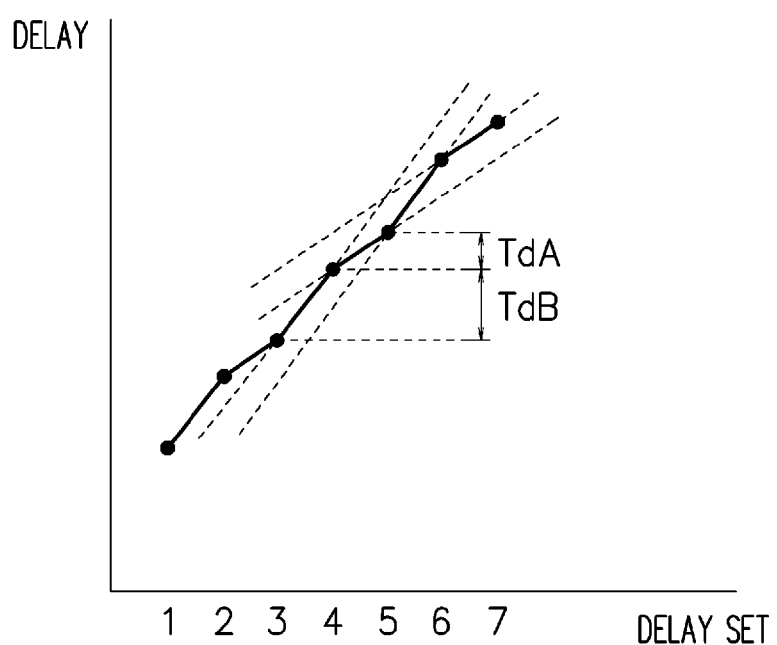
FIG. 2 is a view to explain input/output at the variable delay circuit in this embodiment.
FIG. 3 is a view illustrating a relationship between a delay set and a delay time of the variable delay circuit in this embodiment.

Hereinafter, an embodiment will be described with reference to the drawings.

FIG. 1A and FIG. 1B are views illustrating a configuration example of a unit delay circuit in one embodiment, and FIG. 1C is a view illustrating a configuration example of a variable delay circuit in this embodiment. The variable delay circuit in this embodiment includes first unit delay circuits 10A and second unit delay circuits 10B of which circuit configurations are different as unit delay circuits.

The first unit delay circuit 10A includes an inverter 11A and a selector 12A as illustrated in FIG. 1A. In the selector 12A, a first input terminal is connected to a second input terminal DIN2A of the first unit delay circuit 10A, and a second input terminal is connected to a first input terminal DIN1A of the first unit delay circuit 10A. In the selector 12A, a control terminal is connected to a control signal input terminal SELA of the first unit delay circuit 10A. When a logical value of a signal input to the control terminal is "0" (zero), the selector 12A outputs a signal input to the first input terminal, and when the logical value of the signal input to the control terminal is "1", the selector 12A outputs a signal input to the second input terminal. In the inverter 11A, an input terminal is connected to an output terminal of the selector 12A, and an output terminal is connected to a second output terminal DOUT2A of the first unit delay circuit 10A. In the first unit delay circuit 10A, the first input terminal DIN1A and a first output terminal DOUT1A are connected.

When a logical value of a signal input to the control signal input terminal SELA is "0" (zero), a signal input to the second input terminal DIN2A is inverted via the selector 12A and the inverter 11A and output from the second output terminal DOUT2A in the first unit delay circuit 10A. When the logical value of the signal input to the control signal input terminal SELA is "1", a signal input to the first input terminal DIN1A is inverted via the selector 12A and the inverter 11A and output from the second output terminal DOUT2A in the first unit delay circuit 10A. Besides, the signal input to the first input terminal DIN1A is output from the first output terminal DOUT1A in the first unit delay circuit 10A.

The second unit delay circuit 10B includes an inverter 11B and a selector 12B as illustrated in FIG. 1B. In the inverter 11B, an input terminal is connected to a first input terminal DIN1B of the second unit delay circuit 10B, and an output terminal is connected to a first output terminal DOUT1B of the second unit delay circuit 10B. In the selector 12B, a first input terminal is connected to a second input terminal DIN2B of the second unit delay circuit 10B, a second input terminal is connected to the output terminal of the inverter 11B, and an output terminal is connected to a second output terminal DOUT2B of the second unit delay circuit 10B. In the selector 12B, a control terminal is connected to a control signal input terminal SELB of the second unit delay circuit 10B. When a logical value of a signal input to the control terminal is "0" (zero), the selector 12B outputs a signal input to the first input terminal, and when the logical value of the signal input to the control terminal is "1", the selector 12B outputs a signal input to the second input terminal.

When a logical value of a signal input to the control signal input terminal SELB is "0" (zero), a signal input to the second input terminal DIN2B is output from the second output terminal DOUT2B via the selector 12B in the second unit delay circuit 10B. When the logical value of the signal input to the control signal input terminal SELB is "1", a signal input to the first input terminal DIN1B is inverted via the inverter 11B and the selector 12B, and output from the second output terminal DOUT2B in the second unit delay circuit 10B. Besides, the signal input to the first input terminal DIN1B is inverted via the inverter 11B and output from the first output terminal DOUT1B in the second unit delay circuit 10B.

The variable delay circuit in this embodiment includes plural unit delay circuits 10A, 10B connected in series and an output circuit 20 as illustrated in FIG. 1C. In the plural unit delay circuits 10A, 10B, a first output terminal of an i-th stage unit delay circuit and a first input terminal of an (i+1)-th stage unit delay circuit are connected, and a second input terminal of the i-th stage unit delay circuit and a second output terminal of the (i+1)-th stage unit delay circuit are connected. Besides, an input signal SIN is input to a first input terminal of a first-stage unit delay circuit 10A. A delay set signal SDLY[i] being delay set information is input to control signal input terminals SELA, SELB of the i-th stage unit delay circuits 10A, 10B. Note that the "i" is a subscript, and the "i" is a natural number satisfying "i=1 to n".

It is desirable that the number of the first unit delay circuits 10A and the number of the second unit delay circuits 10B held by the variable delay circuit are the same or approximately the same. In the example illustrated in FIG. 1C, each of the first unit delay circuits 10A and the second unit delay circuits 10B are alternately disposed one by one to prevent unbalance of delay times of the unit delay circuits resulting from deterioration of a signal waveform in the plural unit delay circuits 10A, 10B. The unit delay circuits 10A, 10B are alternately disposed as stated above, and thereby, loads become uniform at each path where a signal passes between a path where the signal is transmitted from a front stage side to a rear stage side and a path where the signal is transmitted from the rear stage side to the front stage side independent from a delay set, and it is possible to suppress the deterioration of the signal waveform. Besides, at least either one of the inverters 11A, 11B exists on the path where the signal passes through the two unit delay circuits 10A, 10B, and it is possible to suppress the deterioration of the signal waveform.

A signal SDO output from a second output terminal of the first stage unit delay circuit 10A and a delay set signal SDLY

[1:n] being the delay set information are input to the output circuit 20. The output circuit 20 decodes the delay set signal SDLY[1:n], non-inverts or inverts the signal SDO in accordance with a decoding result, and outputs as an output signal SOUT. In this embodiment, each of the unit delay circuits 10A, 10B includes one of the inverters 11A, 11B and one of the selectors 12A, 12B, and therefore, a logical value of the signal SDO becomes different depending on whether the number of delay stages specified by the delay set signal SDLY [1:n] is an odd number or an even number. Accordingly, the output circuit 20 inverts the signal SDO and outputs as the output signal SOUT when the number of delay stages is the odd number. The output circuit 20 non-inverts the signal SDO and outputs as the output signal SOUT when the number of delay stages is the even number.

For example, the output circuit 20 includes a decoder 21 and an exclusive or operation circuit (EX-OR circuit) 22 as illustrated in FIG. 10. The decoder 21 decodes the delay set signal SDLY [1:n]. When the number of delay stages is the odd number as a result of the decoding of the delay set signal SDLY[1:n], the decoder 21 outputs a signal SDEC of which logical value is "1", and when the number of delay stages is the even number, the decoder 21 outputs the signal SDEC of which logical value is "0" (zero). The signal SDO being the output of the delay circuit and the signal SDEC from the decoder 21 are input to the EX-OR circuit 22, and the EX-OR circuit 22 outputs a result of the exclusive or operation performed for the signals as the signal SOUT.

In the variable delay circuit in this embodiment, delay set signals SDLY[1] to SDLY[k−1] are set at "0" (zero) and a delay set signal SDLY[k] is set at "1" in the delay set signal SDLY[1:n] when the number of delay stages is set to be k-th stage ("k" is a natural number of one to "n"). In addition, a signal is transmitted such that the signal is folded back at k-th stage unit delay circuit 10A or 10B. For example, when the number of delay stages is set at a second stage, the delay set signal SDLY[1:n] is set at "010000 . . . ", and the signal is transmitted such that it is folded back at the second stage unit delay circuit 10B. Besides, for example, when the number of delay stages is set at a third stage, the delay set signal SDLY [1:n] is set at "001000 . . . ", and the signal is transmitted such that it is folded back at the third stage unit delay circuit 10A.

According to this embodiment, each of the unit delay circuits 10A, 10B is constituted by one of the inverters 11A, 11B and one of the selectors 12A, 12B, and thereby, it is possible to increase the resolution of the delay time at the variable delay circuit. Besides, as a logical relationship among the input signal SIN, the signals SDEC, SDO, and the output signal SOUT is illustrated in FIG. 2, the output circuit 20 non-inverts or inverts the signal SDO being the output of the delay circuit in accordance with the delay set signal SDLY[1: n] and outputs it in this embodiment. It is thereby possible to match logical values of the input/output signals even if each of the unit delay circuits 10A, 10B is constituted by one of the inverters 11A, 11B and one of the selectors 12A, 12B.

Note that in the variable delay circuit according to this embodiment illustrated in FIG. 1C, the delay times of the unit delay circuits 10A, 10B are a little different because circuit constitutions of the unit delay circuits 10A, 10B are different. Namely, it is conceivable that changes of the delay times are different depending on whether the number of delay stages set by the delay set signal SDLY[1:n] is the odd number or the even number. As an example is illustrated in FIG. 3, the delay time increases for TdA when the number of delay stages is changed from a certain even number to an odd number in which the number of delay stages is increased by one. Besides, the delay time increases for TdB when the number of delay stages is changed from a certain odd number to an even number in which the number of delay stages is increased by one. A slope in accordance with the delay set thereby becomes discontinuous.

The delay time in accordance with the number of delay stages set by the delay set signal SDLY[1:n] and a change amount thereof are described with reference to FIG. 4A to FIG. 4C. As illustrated in FIG. 4A, a delay time from an input terminal of a buffer 31 to an input terminal of an inverter 32 of a second stage unit delay circuit 10B is set to be tib0. A delay time from the input terminal of the buffer 31 to an input terminal of an inverter 34 via a selector 33 of a first stage unit delay circuit 10A is set to be tib1. A delay time from the input terminal of the inverter 34 to an input terminal of a buffer 35 is set to be tob.

As illustrated in FIG. 4B, a delay time from an input terminal of an inverter 36 of an m-th stage (m is a natural number of two to (n−2)) unit delay circuit 10B to an input terminal of an inverter 37 of an (m+2)-th stage unit delay circuit 10B is set to be twe0. A delay time from the input terminal of the inverter 36 to an input terminal of an inverter 39 via a selector 38 of an (m+1)-th stage unit delay circuit 10A is set to be twe1. A delay time from the input terminal of the inverter 36 to an input terminal of an inverter 42 via a selector 40 of the m-th stage unit delay circuit 10B and a selector 41 of an (m−1)-th stage unit delay circuit 10A is set to be twe2. A delay time from the input terminal of the inverter 39 to the input terminal of the inverter 42 via the selector 40 and the selector 41 is set to be tew0.

The delay times tib0, tib1, tob, twe0, twe1, twe2, and tew0 are defined as for each of the paths as stated above, then the delay times in accordance with the number of delay stages set by the delay set signal SDLY[1:n] and the change amount thereof become as illustrated in FIG. 4C. Namely, when the number of delay stages is changed from a certain odd number value to an even number value increased by one, the delay time increases for TdA (=twe1+tew0−twe2). When the number of delay stages is changed from a certain even number value to an odd number value increased by one, the delay time increases for TdB (=twe0+twe2−twe1).

Figure 5A:
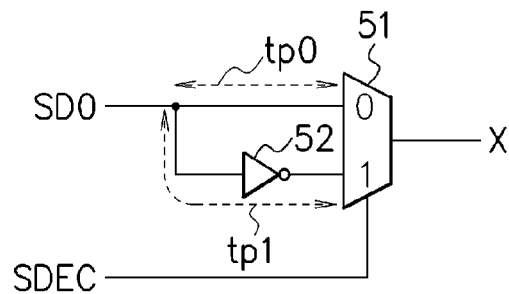
FIG. 5A and FIG. 5B are views schematically illustrating an exclusive or operation circuit in this embodiment.
Figure 5B:
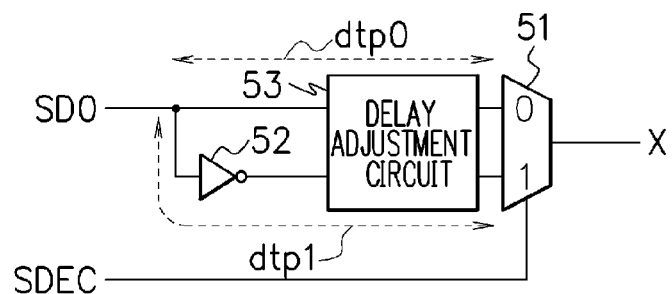

Here, when the EX-OR circuit 22 held by the output circuit 20 illustrated in FIG. 10 is schematically illustrated, then it is represented by a selector 51 and an inverter 52 as illustrated in FIG. 5A. In FIG. 5A, the SDO is a signal output from the second output terminal of the first stage unit delay circuit 10A as the output of the delay circuit, and the SDEC is an output of the decoder 21. As illustrated in FIG. 5A, there is a difference between delay times tp0, tp1 to an input terminal of the selector 51 depending on whether or not the inverter 52 is interposed. Namely, there is a delay difference in the EX-OR circuit 22 whether the signal SDO is inverted output or non-inverted output. Accordingly, a delay adjustment circuit 53 is provided as illustrated in FIG. 5B in this embodiment to adjust the delay times of the respective paths such that a difference between a delay time dtp1 of a path in which the signal SDO is inverted output and a delay time dtp0 of a path in which the signal SDO is non-inverted output does not exist. It is thereby possible to reduce the difference of the delay times in accordance with the delay sets.

Further, the delay adjustment circuit 53 may perform an adjustment of the delay time in consideration of the above-stated change amounts TdA, TdB of the delay times in accordance with the number of delay stages set by the delay set signal SDLY[1:n]. Namely, the delay time corresponding to the TdA is included in the delay time dtp0 of the non-inverted output path of the signal SDO, and the delay time corresponding to the TdB is included in the delay time dtp1 of the inverted output path of the signal SDO in addition to the adjustment amount in accordance with the delay difference originally held by the EX-OR circuit 22 in itself. It is thereby possible to make the change amount of the delay time in accordance with the delay set constant, and to perform a fine delay control.

Figure 6:
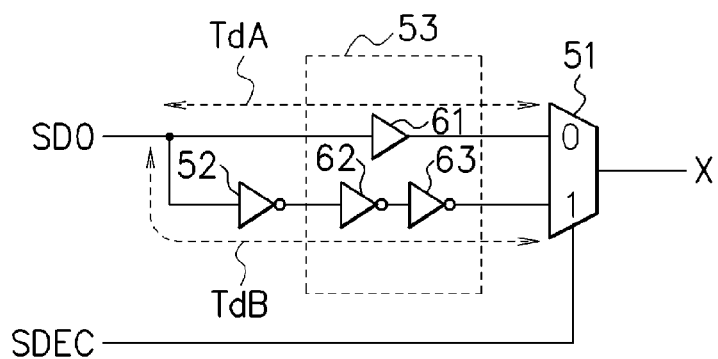
FIG. 6 is a view illustrating an example of a delay adjustment circuit in this embodiment.
Figure 8:
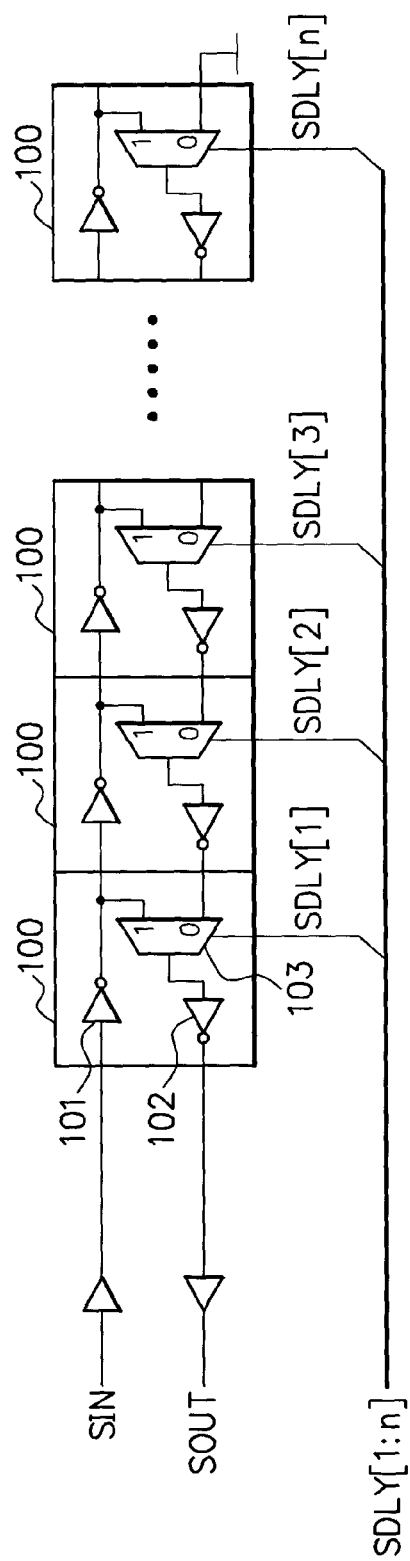
FIG. 8 is a view illustrating a configuration example of a conventional variable delay circuit.

FIG. 6 is a view illustrating an example of the delay adjustment circuit 53. In the example illustrated in FIG. 6, the delay adjustment circuit 53 includes a buffer 61 provided at the non-inverted output path of the signal SDO, and inverters 62, 63 provided at the inverted output path of the signal SDO. For example, the buffer 61, the inverters 62, 63 of the delay adjustment circuit 53 are designed such that a delay time of the non-inverted output path of the signal SDO via the buffer 61 is set to be the TdA, and a delay time of the inverted output path of the signal SDO via the inverters 52, 62, 63 is set to be the TdB, and thereby, it is possible to make the change amount of the delay time in accordance with the delay set constant.

FIG. 7 is a view illustrating another example of the delay adjustment circuit 53. The delay adjustment circuit 53 illustrated in FIG. 7 is to enable to adjust the delay time by control signals DCTL1, DCTL2 from external. The delay adjustment circuit 53 has buffers 71-1, 71-2, 71-3 connected to the non-inverted output path of the signal SDO in parallel and controlled by the control signal DCTL1. Besides, the delay adjustment circuit 53 has buffers 72-1, 72-2, 72-3 connected to the inverted output path of the signal SDO in parallel and controlled by the control signal DCTL2. The buffers 71-1 to 71-3 are drive controlled by the control signal DCTL1, and thereby, the delay time of the non-inverted output path of the signal SDO is controlled. The buffers 72-1 to 72-3 are drive controlled by the control signal DCTL2, and thereby, the delay time of the inverted output path of the signal SDO is controlled. The delay adjustment circuit illustrated in FIG. 7 is suitable to be used in a case when, for example, a temperature, a power supply, and so on are monitored, and a circuit capable of grasping a delay amount of the output circuit 20 when no control is performed under a state exists at outside of the variable delay circuit. The control is performed from external by the control signals DCTL1, DCTL2 in accordance with the monitored temperature, the power supply, and so on, and thereby, it becomes possible to appropriately control the respective delay times of the non-inverted output path and the inverted output path of the signal SDO.

Note that the first unit delay circuits 10A and the second unit delay circuits 10B are alternately connected one by one in the variable delay circuit in this embodiment, but it is not limited thereto. A connection method and the number of the first unit delay circuits 10A and the second unit delay circuits 10B are arbitrary as long as the connection is made such that the delay time increases in accordance with the increase in the number of delay stages set by the delay set signal SDLY[1:n]. For example, the first unit delay circuits 10A and the second unit delay circuits 10B may be alternately connected by every plural pieces. Besides, for example, a group in which the first unit delay circuits 10A are disposed at a front stage side and the second unit delay circuits 10B are disposed at a rear stage side and another group in which the second unit delay circuits 10B are disposed at the front stage side and the first unit delay circuits 10A are disposed at the rear stage side may be alternately connected.

According to the disclosed variable delay circuit, it is possible to increase resolution of delay time without incurring an increase in a component area and deterioration of a signal waveform by connecting plural unit delay circuits including a first unit delay circuit and a second unit delay circuit each having an inverter and a selector and of which circuit configurations are different in series.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A variable delay circuit, comprising:
   plural unit delay circuits are connected in series, and the plural unit delay circuits in which an input signal is input to a first input terminal of a first stage unit delay circuit, a first output terminal of an i-th stage ("i" is a natural number) unit delay circuit and a first input terminal of an (i+1)-th stage unit delay circuit are connected, and a second input terminal of the i-th stage unit delay circuit and a second output terminal of the (i+1)-th stage unit delay circuit are connected; and
   an output circuit to which a signal output from a second output terminal of the first stage unit delay circuit is input, and non-inverts or inverts to output the input signal in accordance with delay set information relating to a delay set,
   wherein one or more of first unit delay circuits and second unit delay circuits are each included in the plural unit delay circuits,
   wherein the first unit delay circuit includes:
      a first selector that outputs a signal input to a second input terminal of the first unit delay circuit when the delay set information corresponding to the first unit delay circuit among the delay set is in a first state, and outputs a signal input to a first input terminal of the first unit delay circuit when the delay set information is in a second state; and
      a first inverter that inverts an output of the first selector and outputs from a second output terminal of the first unit delay circuit, and
      the first input terminal of the first unit delay circuit and a first output terminal of the first unit delay circuit are directly connected,
   wherein the second unit delay circuit includes:
      a second inverter that inverts a signal input to a first input terminal of the second unit delay circuit and outputs from a first output terminal of the second unit delay circuit; and
      a second selector that outputs a signal input to a second input terminal of the second unit delay circuit from a second output terminal of the second unit delay circuit directly when the delay set information corresponding to the second unit delay circuit among the delay set is in the first state, and outputs an output of the second inverter from the second output terminal of the second unit delay circuit directly when the delay set information is in the second state.

2. The variable delay circuit according to claim 1, wherein the first unit delay circuits and the second unit delay circuits are alternately disposed.

3. The variable delay circuit according to claim 1, wherein the output circuit includes a delay adjustment circuit that adjusts a delay time to non-invert and output an input signal and a delay time to invert and output the input signal to reduce a delay difference.

4. The variable delay circuit according to claim 3, wherein the delay adjustment circuit adjusts a difference of a change amount of the delay times resulting from the plural unit delay circuits in accordance with the delay set information.

5. The variable delay circuit according to claim 1, wherein the number of the first unit delay circuits and the number of the second unit delay circuits are the same.

6. The variable delay circuit according to claim 1, wherein plural pieces of the first unit delay circuits and plural pieces of the second unit delay circuits are alternately disposed.

7. The variable delay circuit according to claim 2, wherein the output circuit includes a delay adjustment circuit that adjusts a delay time to non-invert and output an input signal and a delay time to invert and output the input signal to reduce a delay difference.

8. The variable delay circuit according to claim 7, wherein the delay adjustment circuit adjusts a difference of a change amount of the delay times resulting from the plural unit delay circuits in accordance with the delay set information.

9. The variable delay circuit according to claim 3, wherein the delay adjustment circuit adjusts the delay time to non-invert and output the input signal and the delay time to invert and output the input signal based on an input control signal.

* * * * *